United States Patent
Natsuka et al.

(10) Patent No.: US 6,551,753 B1
(45) Date of Patent: Apr. 22, 2003

(54) LIQUID DEVELOPING METHOD OF PRINTED WIRING BOARD

(75) Inventors: Masanori Natsuka, Tokyo (JP); Yasuo Kaneda, Tokyo (JP); Munetoshi Irisawa, Tokyo (JP); Toyokazu Komuro, Tokyo (JP); Noritaka Inoue, Tokyo (JP); Kenji Hyodo, Tokyo (JP)

(73) Assignee: Mitsubishi Paper Mills Limited, Tokyo (JP)

(*) Notice: Subject to any disclaimer, the term of this patent is extended or adjusted under 35 U.S.C. 154(b) by 0 days.

(21) Appl. No.: 09/550,310

(22) Filed: Apr. 14, 2000

(30) Foreign Application Priority Data

Apr. 15, 1999 (JP) .......................................... 11-107558
Jun. 29, 1999 (JP) .......................................... 11-183012
Nov. 18, 1999 (JP) .......................................... 11-327837

(51) Int. Cl.$^7$ .......................... G03G 13/10; G03G 13/11
(52) U.S. Cl. ........................................ 430/100; 430/117
(58) Field of Search ................... 430/31, 100, 97, 430/103, 117, 118, 119, 102

(56) References Cited

U.S. PATENT DOCUMENTS 4,327,167 A  4/1982  Tanabe ........................ 430/31
5,494,764 A  * 2/1996  Hyodo ........................ 430/31

FOREIGN PATENT DOCUMENTS

| EP | 1018858 A1 | * 7/2000 |
| JP | 6-112627 | 4/1994 |
| JP | 6-224541 | 8/1994 |
| JP | 8-102582 | 4/1996 |
| WO | WO99/52335 | 10/1999 |

* cited by examiner

Primary Examiner—Janis L. Dote
(74) Attorney, Agent, or Firm—Paul E. White, Jr.; Manelli Denison & Selter PLLC

(57) ABSTRACT

There is disclosed a liquid developing method of a printed wiring board using a one-surface stepwise developing system which forms a resist pattern stepwisely according to an electrophotographic reverse developing method on each surface of a material to be developed obtained by forming photo-conductive layers on both surfaces of a both-surfaces copper-clad laminated board, wherein the method comprises the steps of subjecting to a static charging treatment on a surface to which no electrostatic latent image is formed which surface is positioned opposing to an electrostatic latent image-formed surface which is a surface to be exposed, or to a non-developing surface between completion of an exposure treatment and before a liquid toner developing treatment, and subjecting to the liquid toner developing treatment to form a toner image corresponding to the resist pattern on the electrostatically latent image-formed surface.

6 Claims, 1 Drawing Sheet

LIQUID DEVELOPING METHOD OF PRINTED WIRING BOARD

BACKGROUND OF THE INVENTION

1. Field of the Invention

This invention relates to a preparation of a printed wiring board utilizing an electrophotographic reverse developing method which uses a material to be developed having a metal conductive layer and a photoconductive layer in this order on at least one surface of an insulating substrate, particularly to a liquid developing method which gives a resist image by applying a liquid toner developing treatment onto the material to be developed having a static latent image.

2. Prior Art

A method for making a printed wiring board is roughly classified into two methods of the subtractive method and the additive method. The subtractive method is a method in which a resist layer is formed on a laminated board to which a conductive layer such as copper, etc. is provided on an insulating substrate, and the conductive layer not covered by the resist layer is removed by etching. The additive method is a method in which a conductive layer is formed only at a wiring pattern portion on an insulating substrate. In addition to the above, it has been proposed a wiring transfer method in which a resist image is provided on a conductive substrate by a plate resist, metal plating is applied to the conductive substrate other than the resist image to form a metal wiring pattern, and then, after the resist image is removed, only the metal wiring pattern is transferred to the insulating material.

Preparation of a resist layer utilizing an electrophotographic method is carried out as mentioned below. A photoconductive layer is provided on a copper-clad laminated board, and after uniformly charging the surface of the photoconductive layer in a dark place, exposure is carried out according to a wiring pattern whereby charging at the exposed portion disappears and an electrostatic latent image can be formed. The electrostatic latent image is subjected to toner developing treatment and fixing to form a toner image, and by using the toner image as a resist, the photoconductive layer other than the toner image portion is dissolved and removed to prepare a resist image of a metal conductive layer comprising the toner image and the photoconductive layer. Dissolution and removal of the unnecessary portion of the metal conductive layer and the subsequent preparation step of the printed wiring board can be carried out in the same manner as in the conventional procedure.

When the electrophotographic method by the reverse developing method (hereinafter simply referred to as "an electrophotographic method") is used, procedure is carried out that the surface of a photoconductive layer is charged in a dark place and forming an electrostatic latent image is formed by vanishing a charge at the exposed portion by exposing an image portion, and then, fine toner particles having the same polarity as those of the charged electric charge are adhered to the exposed portion, i.e., to a portion at which the electric charge is vanished. At this time, a conductive member called a developing electrode is provided opposed to the surface of an electrostatic latent image, and a bias voltage with the same polarity is applied to the electrode whereby adhesion of the toner particles to the exposed portion is promoted and a toner image with a high image quality can be obtained.

A method of preparing a resist layer to the both surfaces of a substrate utilizing the electrophotographic method has been disclosed in Japanese Provisional Patent Publication No. 224541/1994, and it is possible to form toner images on the both surfaces by simultaneously developing both surfaces of a laminated board in which a metal conductive layer and a photoconductive layer are provided on the both surfaces of an insulating substrate.

At present, in a progress of high density preparation of a printed wiring board, a printed wiring board having a lot of conductive fine pores called through holes provided to respective substrate with a multi-layered structure has been prepared. In this case, circuits formed on the both surfaces of the substrate are connected by the through holes. Thus, not only precision of the circuit itself formed on the substrate but also precision of formed positions of the circuits on the both surfaces relative to the through holes as a standard, i.e., positional precision prior to formation of the resist film are required.

Moreover, according to the recent trend of making light, thin, short and compact, or variety of electronic devices, in a printed wiring board, it is now required to make it with high density and within a short period of time. Also, a direct drawing method by the use of data from a computer using a flat bed scanning exposure device which uses laser beam or light emitting diode in place of the conventional surface exposure drawing method using a photomask has now been investigated. An application of an electrophotographic material has been investigated as a resist material.

As a flat bed scanning exposure device to be used for preparing a resist film utilizing the electrophotographic method, it is possible to use a device which uses various kinds of lasers or light emitting diode as a light source. During exposure, it is carried out by moving at least either one of an optical system or a material to be exposed placed on a flat bed.

When a both-surfaces printed wiring board is to be prepared by using the flat bed scanning exposure device to be used in the above-mentioned direct drawing method, there may be mentioned a method in which one surface of a laminated board is statically charged and exposed, then the laminated board is turned over, and the other surface of the laminated board is statically charged and exposed to effect both surfaces exposure, and toner development is carried out on the both surfaces simultaneously, or a method in which one surface of a laminated board is statically charged, exposed and subjected to toner development, and then, the other surface of the same is similarly treated to form a resist pattern. In the former method, an electrostatic latent image is contacted with the flat bed after turn over so that the electrostatic latent image is likely disturbed whereby any measure to prevent such a disturbance is required. To the contrary, in the latter method, a non-developed surface is not statically charged at the time of toner development so that there is a possibility of causing stain at the non-developed surface due to an excess amount of the toner. However, the latter method is capable of processing the surface to which an electrostatic latent image is formed without contacting any material. Thus, the latter method (hereinafter referred to as "a one-surface stepwise developing system") has been investigated nowadays as a process for producing a both-surfaces printed wiring board by the direct drawing method.

Moreover, when a both-surfaces printed wiring board having a through hole(s) is to be prepared, depending on the size of a diameter of the through hole(s) and a thickness of a material to be developed, a problem occurs that toner is electrodeposited on a non-developed surface side of a penetrated through hole(s) by a bias voltage to cause a defect at the time of liquid toner development by carrying out the above-mentioned one-surface stepwise developing system.

Also, in the above-mentioned one-surface stepwise developing system, when a thin copper-clad laminated board having a thickness of 0.4 mm or less is used as a substrate, the substrate bends between electrodes (which also varies depending on the size of the material to be developed) so that the change in the distance of gaps between the electrode and the substrate causes a problem. At this time, a bottom side of the substrate is contacted with rolls to move the substrate so that a non-developed surface statically charged is contacted with the rolls whereby the statically charged state of said non-developed surface is disturbed. Also, a liquid toner migrated from the development surface side to the non-development surface side adheres to said non-development surface ununiformly so that stain slightly remains at the non-development surface side in some cases. Thus, the method finally brings a result that it is inferior in reliability as a preparation process of a printed wiring board.

In the above-mentioned phenomenon, stain at the back surface can be prevented when the non-development surface is not statically charged contrary to the above. In this case, however, an electric field of the development surface migrates to around the hole of a relatively large-sized through hole(s) or a register hole provided at an edge portion of the printed wiring board whereby the liquid toner is electrodeposited at around the hole(s) which causes a problem of stain.

Also, the above conveying rolls of the electrode portion is subjected to contact conveying so that stain caused by the liquid toner developer is accumulated on the roll surface whereby stain on the surface of the non-development material occurs in some cases.

On the other hand, with regard to these liquid developing methods, it is essential requirement that an excessive liquid toner shall not be brought into the substrate after the developing treatment by the liquid toner, and to realize the requirement, various kinds of processing devices or processing methods have been proposed. For example, in a printed wiring board processing device disclosed in Japanese Provisional Patent Publication No. 102582/1996, by providing at least one pair of squeezing rolls at the downstream side of developing electrodes and at least one pair of liquid-absorbing rolls having capillary action at the further downstream side of the squeezing rolls, an excessive amount of liquid toner can be completely removed including an excessive solution in a through hole(s) even when the material to be developed has a through hole(s). In this reference, as a constitution of the pair of the liquid squeezing rolls, two liquid-absorbing rolls are generally employed.

However, when a large number of sheets are intermittently carried out for a long period of time by the liquid development using the above-mentioned method, a balance between a toner particle amount and a charge thereof of the liquid toner possessed by the liquid absorbing roll becomes bad due to the reason of condensation, etc. At this time, the material to be developed is conveyed while absorbing the liquid toner at the state that a nip is loaded under a constant pressure to the pair of liquid-absorption rolls. Simultaneously, the liquid toner possessed by the pair of the liquid-absorption rolls is exhausted at the upper stream side so that if a charge balance of the liquid toner exhausted is bad, a formed pattern is sometimes disturbed in some cases.

SUMMARY OF THE INVENTION

An object of the present invention is, when preparing a both-surfaces printed wiring board by the electrophotographic reverse developing method, to provide a liquid developing method which can prevent occurrence of an image defect caused by liquid toner stain at a non-developing surface when the one-surface stepwise developing system is applied irrespective of a thickness of a both-surfaces printed wiring board, which can prevent occurrence of a liquid toner stain at the non-developing surface including a neighbor of a through hole(s) when a both-surfaces printed wiring board having a through hole(s) is prepared, which can remove an excessive amount of the toner simply, easily and efficiently in the through hole(s) and the surface of an electrophotographic laminated board after the developing processing and can realize to form a wiring pattern corresponding to an electrostatic latent image for a long period of time with good reproducibility.

The present inventors have earnestly studied to accomplish the above objects, and as a result, they have found that these objects can be accomplished by a liquid developing method of a printed wiring board which comprises, for preparing a printed wiring board by applying a one-surface stepwise developing system which forms a resist pattern on each surface stepwisely according to an electrophotographic reverse developing method using a material to be developed obtained by forming photo-conductive layers on both surfaces of a both-surfaces copper-clad laminated board, subjecting a non-electrostatic latent image formed surface which is an opposite surface to a latent image formed surface which is a surface to be exposed, i.e., a non-developing surface to static charging treatment during completion of an exposure treatment and before a liquid toner developing treatment, and then, subjecting the non-developing surface to the liquid toner developing treatment whereby a toner image corresponding to the resist pattern can be formed on the electrostatic latent image surface.

That is, in either of the surfaces, by subjecting a non-electrostatic latent image formed surface to which no developing treatment is desired to be carried out to static charging treatment, a toner image can be formed on an electrostatic latent image-formed surface (a surface to be developed) by the developing treatment, and also, unexpected formation of a toner image on a non-developed surface which is a non-electrostatic latent image-formed surface can be prevented. By applying a role of the operation as mentioned above to the case where a toner image is to be formed by subjecting to the liquid toner developing treatment in place of the above-mentioned non-developed surface, a high quality toner image without no toner stain on the both surfaces of the material to be developed can be formed.

For producing a printed wiring board to which resist patterns are formed on the both surfaces of a material to be developed obtained by formation of photoconductive layers on the both surfaces of a both-surfaces copper-clad laminated board by applying the one surface stepwise developing system to the board, the procedure can be carried out as follows: First, a static charging treatment is applied to the non-developing surface during the time period of after completion of the exposure treatment and before the liquid toner developing treatment, then, a toner image corresponding to a resist pattern is formed on an electrostatic latent image-formed surface by the liquid toner developing treatment. Thereafter, the material to be developed is overturned, an electrostatic latent image is formed on the non-developed surface in the same manner as mentioned above. Then, the static charging treatment is applied to the surface opposite to the electrostatic latent image-formed surface (i.e., the toner image formed surface) and the liquid toner developing treatment is applied thereto to form a resist pattern on the other surface of the material to be developed.

Moreover, when a printed wiring board is prepared by applying a one-surface stepwise developing system which forms a resist pattern on each surface stepwise according to an electrophotographic reverse developing method using a material to be developed having a through hole(s), which is obtained by forming photoconductive layers on both surfaces of a both-surfaces copper-clad laminated board, it is possible to prevent occurrence of toner stain at around a through hole(s) at a non-developed surface by subjecting to the same or similar treatment as mentioned above.

A surface potential of the non-developing surface obtained as a result of the statically charging treatment to the above-mentioned non-developing surface may be 80 V or more.

Also, the liquid developing method of a printed wiring board according to the above-mentioned method can be accomplished by, in a liquid developing device which is subjecting to a liquid toner developing treatment of a material to be developed on which an electrostatic latent image is provided by applying a suitable static charging on one surface of a material to be developed obtained by forming photoconductive layers on the both surfaces of a both-surfaces copper-clad laminated board and to an exposure treatment, a liquid developing device of a printed wiring board which comprises a liquid toner feeding portion, and a statically charging means for statically charging the surface of said material to be developed substantially immediately before a developing electrode portion. However, said statically charging means is not necessarily provided in said liquid developing device and it may be provided at substantially immediately after the exposure treatment portion to substantially immediately before the portion at which the liquid toner is fed to the electrostatic latent image surface.

Accordingly, the liquid developing method of the present invention is a method of obtaining resist patterns on the both surfaces of a material to be developed, which comprises forming an electrostatic latent image on one surface of the material to be developed according to a statically charging step and an exposure step, and then, applying statically charging, liquid toner development, drying and fixing treatments on a non-developed surface to form an electrostatic latent image on the back surface of the material to be developed again, and subjecting the back surface to the same treatment as in the front surface.

Moreover, the present inventors found that the above-mentioned objects can be accomplished by a liquid developing method of a printed wiring board which comprises, among the steps of preparing a printed wiring board by applying a one-surface stepwise developing system which forms a resist pattern on each surface stepwise according to an electrophotographic reverse developing method using a material to be developed obtained by forming photoconductive layers on both surfaces of a both-surfaces copper-clad laminated board, when liquid development is carried out by transferring the material to be developed with a state that a bottom side of the material to be developed as a non-developing surface is substantially level with the ground, substantially level transferring of the material to be developed at developing electrodes portion is carried out with electrodes portion conveying rolls and simultaneously a liquid toner may be fed to the whole surface of said non-developing surface substantially uniformly.

They have also found that by closely contacting a liquid-absorption sheet to the surfaces of said electrodes portion conveying rolls from the bottom portion of said electrodes portion conveying rolls, no problem occurs even when a large number of sheets are treated intermittently for a long period of time. More specifically, when the liquid-absorption sheet is adhered to the surface of the electrodes portion conveying rolls during they are rotating, it is sufficient if the state that the roll surfaces of the electrodes portion conveying rolls which contact with the material to be developed are not stained can be maintained.

They have further found that these objects can be accomplished by a liquid developing method of a printed wiring board which comprises, for preparing a printed wiring board by applying a one-surface stepwise developing system which forms a resist pattern on each surface stepwise according to an electrophotographic reverse developing method using a material to be developed obtained by forming photoconductive layers on both surfaces of a both-surfaces copper-clad laminated board, removing an excessive amount of a toner at the liquid toner developing treatment by combination of a liquid-absorption roll having a capillary function at the non-developing surface side and a roll made of an elastic material having no liquid-absorbing property at the developing surface with regard to a pair of liquid-squeezing rolls provided at the downstream side of the developing electrodes.

DESCRIPTION OF THE PREFERRED EMBODIMENTS

In the following, the liquid developing method of the printed wiring board according to the present invention is explained in detail.

The liquid developing method of the printed wiring board according to the present invention is basically a method of applying a liquid toner developing treatment for preparing a printed wiring board by utilizing an electrophotographic reverse developing method. Among the steps of preparing a printed wiring board having circuits on the both surfaces thereof from a material to be developed (identified by reference label 1 in both FIGS. 1 and 2) having at least photoconductive layers on the both surfaces of a both-surfaces copper clad-laminated board, it carries formation of resist patterns (toner images) corresponding to wiring patterns.

As a liquid developing device capable of applying to the liquid developing method of the present invention, there may be mentioned, for example, systems such as one-surface transverse, horizontal development in which an electrostatic latent image-formed surface of a substrate (or a material to be developed) which had conventionally been used is conveyed substantially horizontally to the vertical direction and a toner is supplied to one surface of the substrate from the upper surface or the lower surface; one-surface lateral horizontal development in which a substrate is put up and conveyed substantially vertically and a toner is supplied to one surface of the substrate as disclosed in Japanese Provisional Patent Publication No. 91649/1990; both-surfaces transverse horizontal development in which a substrate is laid and conveyed substantially horizontally and a toner is supplied to both surfaces of the substrate from up and down as disclosed in Japanese Provisional Patent Publication No. 224541/1994; and both-surfaces lateral horizontal development in which a substrate is put up and conveyed substantially vertically and a toner is supplied to both surfaces thereof as disclosed in Japanese Provisional Patent Publication No. 142949/1998. Basic treatments of the toner image forming methods, i.e., a liquid toner developing treatment, a drying treatment and a fixing treatment methods to be used in the present invention are to follow the liquid developing method according to the electrophotographic reverse developing method mentioned in the above references.

Figure 1:
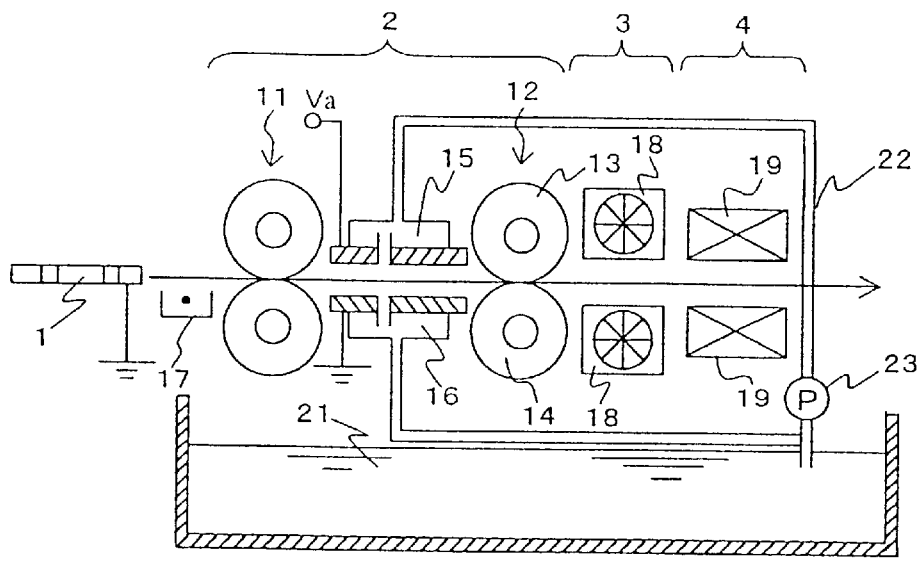
FIG. 1 is a sectional view showing a constitution of one example of a printed wiring board-liquid developing device which can be applied to the present invention.

FIG. 1 is a sectional view showing constitution of an example of a liquid developing device for a printed wiring board which can be applied to the present invention. In FIG. 1, the liquid developing device has substantially the same constitution as in the above-mentioned both-surfaces horizontal level developing system for treating a material to be developed having a through holes(s). In addition to the above, a statically charging means 17 is newly provided at the bottom portion (a non-developing surface side) at the portion substantially immediately before the liquid toner developing step. Said statically charging means 17 realizes to statically charge the bottom surface (a non-developing surface) of a material to be developed 1 substantially uniformly before effecting the liquid toner developing step. More specifically, said liquid developing device comprises a liquid toner developing portion 2, a drying portion 3, and a fixing portion 4. The liquid toner developing portion 2 comprises developing electrodes 15 which can apply a bias voltage simultaneously with feeding using pipe 22 and pump 23 of a liquid toner 21, grounded electrodes 16 at the bottom side which can feed the liquid toner according to the same structure as in the developing electrodes, a pair of conveying rolls 11 and a pair of squeezing rolls 12 (both are rolls made of liquid-absorbing materials), and a toner image is formed on the electrostatic latent image obtained by the above-mentioned steps of statically charging and exposure steps. Here, the pair of the squeezing rolls 12 may be sufficient so long as they can remove an excessive amount of liquid toner bringing into the subsequent steps from the liquid toner developing portion. The squeezing rolls 12, comprise an upper squeezing roll 13 and a lower squeezing roll 14. Both squeezing rolls 13 and 14 have liquid-absorbing properties. As the squeezing rolls, a roll made of an elastic material or a liquid-absorbing roll may be applied depending on necessity. Also, the drying portion 3 is to carry out evaporation and removal of a dispersing medium in the liquid toner remained on the surface by a ventilation means 18 whereby the liquid toner is dried. The fixing portion 4 is to complete fusion and fixation of a toner image by a heating means 19 to obtain a resist pattern corresponding to a wiring pattern on one surface of the material to be developed 1.

The liquid developing method of a printed wiring board according to the present invention comprises introducing a material to be developed in which an electrostatic latent image is formed on one surface thereof into the above-mentioned liquid developing device, while feeding a liquid toner to the surface to which the electrostatic latent image is formed, a bias voltage is simultaneously applied to the same to effect liquid toner development. At this time, to the other surface of a non-developed surface, a statically charging treatment is applied by a statically charging means 17 provided substantially immediately before the liquid toner developing portion 2. Then, by effecting a drying step and a fixing step, a toner image corresponding to a wiring pattern is formed on the other surface. Thereafter, when the same treatments as mentioned above are applied again to the non-developed surface, it is possible to form good wiring patterns having no stain due to the liquid toner on the both surfaces of the material to be developed.

Moreover, for preparing a printed wiring board having a through hole(s) by using a material to be developed obtained by forming photoconductive layers on the both surfaces of a both-surfaces copper clad laminated board having a through hole(s), when the same liquid toner developing treatment is carried out after subjecting to statically charging treatment to the non-developed surface in the same manner as mentioned above, it is possible not only to prevent toner stain on the non-developed surface but also to prevent toner electrodeposition action in which the toner migrates from the developed surface to the non-developed surface through the through hole(s).

As a statically charging method on the non-developed surface, it has been conventionally known a non-contact statically charging method such as a corotron system and a scorotron system, and a contact statically charging method such as a conductive brush statically charging or a conductive roll statically charging. As the statically charging method to be used in the present invention, any of these systems may be employed so long as it is possible that the photoconductive layer according to the present invention is uniformly statically charged and a potential with a certain degree or more can be ensured.

Also, with regard to a statically charged potential of a non-developed surface, it is suitable when it is 80 V or more. With regard to the upper limit of the surface potential, it varies depending on the composition and thickness of the photoconductive layer, but it may be acceptable with such a degree that leakage of charge due to electrical discharge is not generated. Also, for measuring the statically charged potential, it is possible to apply general non-contact surface voltage indicator.

Figure 2:
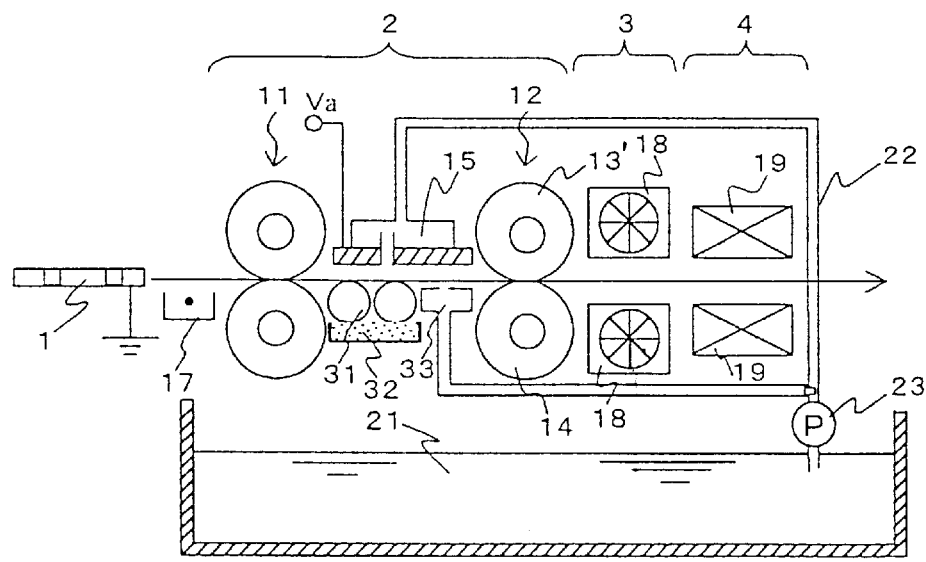
FIG. 2 is a sectional view showing a constitution of another example of a printed wiring board-liquid developing device which can be applied to the present invention.

In FIG. 2, a sectional view showing constitution of another example of a liquid developing device for a printed wiring board which can be applied to the present invention is shown. The different points of the device shown in FIG. 2 from that of FIG. 1 are that electrode portion conveying rolls 31 and a liquid feeding means 33 at the bottom side are provided immediately before the pair of the squeezing rolls 12 in place of the grounded electrodes 16 at the bottom side of the material to be developed 1. Moreover, the constitution of the pair of the squeezing rolls 12 is so made that a liquid-absorbing roll having a capillary action is used as a lower squeezing roll 14 at the non-developing surface side and a roll made of an elastic material having no liquid-absorbing property as an upper squeezing roll 13' at the developing surface side in combination. Others are the same as in the device of the embodiment shown in FIG. 1.

Also, the liquid developing method of a printed wiring board according to the present invention comprises statically charging one surface of a material to be developed (e.g., an electrophotographic laminated board obtained by forming photoconductive layers on both surfaces of a both-surfaces copper-clad laminated board), and forming an electrostatic latent image by effecting a wiring pattern exposure to the statically charged surface by an exposing device, then, by using the above-mentioned liquid developing device, subjecting to liquid toner development of said electrostatic latent image formed surface by feeding a liquid toner and simultaneously applying to a bias voltage at the state that a static treatment is being applied to the non-developed surface by a statically charging means. At this time, even when the material to be developed is a thin and flexible material, the material can be conveyed according to the electrode portion conveying rolls 31, the developing solution feeding means 33 at the bottom side and a roll cleaning means 32, and it is possible to usually prevent stain at the non-developed surface. Thereafter, by effecting a drying step and a fixing step, a toner image corresponding to a wiring pattern can be formed on one surface. Thereafter, when the same treatments as mentioned above are applied again to the non-developed surface, it is possible to form good wiring patterns having no stain due to the liquid toner on the both surfaces of the material to be developed.

Moreover, at the time of removing an excessive amount of the liquid toner developing solution by the pair of the squeezing rolls 12, even when an electrophotographic laminated board is conveyed by nipping between a roll made of an elastic material (an upper squeezing roll 13) and a liquid-absorbing roll (a lower squeezing roll 14), the nip surface of said liquid-absorbing roll usually follows to the thickness of the substrate so that removal of the liquid toner developing solution can be completely carried out without using any (auxiliary) excessive liquid removing device such as an air knife, etc.

Furthermore, in an electrophotographic laminated board having a through hole(s), according to capillary action of the liquid-absorbing roll (a lower squeezing roll 14), it is possible to remove an excessive liquid toner developing solution from one side of the through hole(s).

At this time, when the upper side of the pair of squeezing rolls 12 is a liquid-absorbing roll, a bad effect is exerted due to the liquid toner discharged from the liquid-absorbing roll itself in some cases. In the present invention, by using a roll made of an elastic material having no liquid-absorbing property as an upper squeezing roll as shown in FIG. 2, it is realized to form a toner image with good reproducibility even when a large number of sheets are processed intermittently for a long period of time.

Also, with regard to the roll made of an elastic material (an upper squeezing roll 13) among the pair of the squeezing rolls 12, it comprises an elastic material provided at least at an axis and an outer peripheral surface. As the elastic material, natural rubber, butyl rubber, nitrile rubber, etc. may be used. Also, it is preferred that both of the axis and the elastic material have a resistance to the liquid toner developing solution.

The liquid-absorbing roll (a lower squeezing roll 14) of the pair of the squeezing rolls 12 comprises a liquid absorbing material having capillary action provided at least at an axis and an outer peripheral surface. As a liquid-absorbing material, there may be used a material in which an elastic material such as natural rubber, butyl rubber, urethane rubber, nitrile butyl rubber, etc. is made a sponge structure. Also, it is preferred that both of the axis and the elastic material have a resistance to the liquid toner developing solution.

EXAMPLES

In the following, Examples of the present invention are explained more specifically by referring to FIG. 1 and FIG. 2, but the present invention is not limited only by the following Examples so long as it does not extend the scope of the invention.

Here, examples in which a liquid developing method of a material to be developed having a though hole(s) are described. With regard to the liquid developing method of a material to be developed having no through hole, the effect can be evaluated by observing the presence or absence of stain due to the liquid toner on the back surface of the material to be developed.

Example 1

(i) Preparation of a Material to be Developed (Formation of Photoconductive Layers)

A through hole with a size of 0.3 mm$\phi$ is provided at a predetermined portion of a rectangular shaped both-surfaces copper laminated board (available from Mitsubishi Gas Chemical Co., Ltd., CCL-E170, trade name) with a size of 340 mm×512 mm×0.6 mm (a copper film thickness: 18 $\mu$m) according to the desired wiring pattern, and a copper layer with a thickness of 8 $\mu$m was formed at the inside of the through hole and the surface of the laminated board according to an electroless copper plating (available from Okuno Chemical Industries Co., Ltd., PROCESS M, trade name) and an electrolytic copper plating (copper sulfate plating). Moreover, photoconductive layers were formed on the both surfaces of the material to be developed with thicknesses of 5 $\mu$m according to the dipping method. At this time, no photoconductive layer is formed at one side of the short side of said material to be developed with a width of 10 mm from the edge portion to ensure a margin for ground. According to the above procedure, the material to be developed having a through hole an inner surface of which is formed the photoconductive layer was prepared.

(ii) Formation of an Electrostatic Latent Image

In a dark place, a surface to be developed (one surface) of said material to be developed was substantially uniformly charged to +250V by using a corona statically charging device. Then, by using a scanning type LED exposure machine (manufactured by Lavenir Co., U.S.A., PULSAR 8000, trade name), a scanning exposure treatment was applied to the material to be developed with a red LED so that an electrostatic latent image corresponding to a resist image was formed. Incidentally, said PULSAR 8000, trade name is an exposure machine of a type in which a platen on which a substrate is placed at the time of exposure is moved to effect scanning exposure.

(iii) Formation of a Resist Image (Liquid Developing Treatment)

Next, a liquid developing treatment was applied to the electrostatic latent image-formed surface of the material to be developed by using a liquid developing device which is of the type of the above-mentioned liquid developing device shown in the FIG. 1, is capable of subjecting to liquid developing of the material to be developed with a width of 510 mm and a statically charging means 17 of a non-developing surface of which is a corona statically charging system. More specifically, the material to be developed was so placed at an inlet portion of the device that an upper surface of which became the surface to be developed to which an electrostatic latent image had been formed, and conveying of the material was started with 1.0 m/min. Thereafter, by applying a corona statically charging treatment to the non-developing surface (a bottom surface) from the conveying direction, the surface thereof was statically charged to +70V. Then, at the liquid toner developing portion 2, a liquid toner (positive charge toner, available from Mitsubishi Paper Mills, Ltd., "ODP-TW", trade name) was fed to an upper surface and simultaneously a bias voltage of +150V was applied to the same, electrodeposition of the liquid toner to the surface to be developed according to the electrophotographic reverse developing method was completed. At this time, an excessive amount of a dispersing medium was removed by a pair of squeezing rolls 12 as much as possible. Moreover, at a drying portion 3, the dispersing medium in the liquid toner remained at the surface of the material to be developed was evaporated and removed by a ventilation means 18 to effect drying of the liquid toner. Then, at a fixing portion 4, fusion and fixation of toner particles were completed by a heating means 19 to obtain a resist pattern corresponding to a wiring pattern and liquid development was finished on one surface of the material to be developed. At this time, unevenness of stain due to the toner was slightly admitted on the non-developing surface at the portion other than the through hole. Also, at the portion of the surface close to the though hole, specific stain due to the toner was not admitted and good conditions were retained.

The material to be developed wherein the resist pattern had been formed on one surface thereof was subjected to an alkali developing treatment at this time in a 1% aqueous sodium carbonate solution at 30° C., the photoconductive layer at the portion other than the resist pattern could be well removed and the unevenness of slight stain due to the toner as mentioned above caused no problem.

Moreover, the non-developing surface was subjected to statically charging, exposure and the liquid developing treatment with the corona statically charging treatment similarly as mentioned above, unevenness of stain due to the toner was also slightly admitted. However, after the alkali development, patterns with no defect could be obtained on the both surfaces of the material to be developed.

Example 2

In the same manner as in Example 1, a material to be developed having a through hole was prepared. After forming an electrostatic latent image on one surface of the material, liquid development was carried out with the state of statically charging the non-developing surface to 85V, resist images were formed on the both surfaces of the material to be developed having a through hole. As a result, no stain due to the toner was admitted on the surfaces including the portion close to the through hole of the material to be developed. Moreover, when the inner surface of the through hole was observed by a microscope, the toner was confirmed to be adhered on the whole surface at the inside of the through hole and no defect was observed.

Example 3

An electrophotographic laminated board on the both surfaces of a rectangular shaped both-surfaces copper laminated board (available from Mitsubishi Gas Chemical Co., Ltd., CCL-E170, trade name) with a size of 340 mm×512 mm×0.1 mm (a copper film thickness: 18 $\mu$m) were formed photoconductive layers with a thickness of 5 $\mu$m prepared by the dipping method was prepared. At this time, no photoconductive layer is formed at one side of the short side of said material to be developed with a width of 10 mm from the edge portion to ensure a margin for ground.

Thereafter, an electrostatic latent image was formed on one surface of the same in the same manner as mentioned above. Then, a liquid developing treatment was applied to the electrostatic latent image-formed surface of the material to be developed by using a liquid developing device which was of the type of the above-mentioned liquid developing device shown in the FIG. 2, which was capable of subjecting to liquid developing of the material to be developed with a width of 510 mm, to which two electrode portion conveying rolls 31 made of a nitrile butyl rubber, a shower-type developing solution-feeding means 33 at the bottom side, and a roll cleaning means 32 to which a liquid-absorption sheet having a pore size of 5 to 10 $\mu$m, a void ratio of about 80% and having a high liquid-maintaining property is applied, were provided. First, the electrophotographic laminated board was so placed at an inlet portion of the device that an upper surface of which became the surface to be developed to which an electrostatic latent image had been formed, and conveying of the material was started with 1.0 m/min. Thereafter, by applying a corona statically charging treatment to the non-developing surface from the conveying direction, the surface thereof was statically charged to +85V substantially uniformly. Then, at the liquid toner developing portion 2, a liquid toner (positive charge toner, available from Mitsubishi Paper Mills, Ltd., "ODP-TW", trade name) was fed to an upper surface and simultaneously a bias voltage of +150V was applied to the same, electrodeposition of the liquid toner to the surface to be developed according to the electrophotographic reverse developing method was completed. At this time, an auxiliary conveying of the material to be developed in the electrodes was carried out by the electrodes portion conveying rolls 31, and the liquid toner developing solution was uniformly fed with a flow amount of 5 L/min to the non-developing surface according to the liquid feeding means 33 at the bottom side. Moreover, at a drying portion 3, the dispersing medium in the liquid toner remained at the surface of the material to be developed was evaporated and removed by a ventilation means 18 to effect drying of the liquid toner. Then, at a fixing portion 4, fusion and fixation of toner particles were completed by a heating means 19 to obtain a resist pattern corresponding to a wiring pattern whereby liquid development of one surface of the electrophotographic laminated board was carried out. At the present stage, no stain due to the liquid toner was admitted on the non-developed surface.

Moreover, the non-developing surface was similarly subjected to statically charging, exposure and the liquid developing treatment to which the corona statically charging treatment was added similarly as mentioned above, to obtain good resist image with no toner stain at the both surfaces of the electrophotographic laminated board.

Example 4

In the same manner as in Example 3, an electrophotographic laminated board with a thickness of 0.1 mm was prepared. After forming an electrostatic latent image on one surface thereof, when liquid toner developing treatment was carried out without feeding the liquid toner developing solution according to the developing solution feeding means 33 at the bottom side, occurrences of stain and unevenness due to the liquid toner developing solution were admitted.

At this time, the material to be developed one surface of which a resist pattern was formed was subjected to alkaline developing treatment by using an aqueous 1% sodium carbonate solution at 30° C. When the whole surfaces of the material to be developed were inspected in detail, a defect which became open circuit was found out at a few portion. However, the defect with such a degree could be removed at the time of inspection of the product. By carrying out the following procedure with regard to the resulting material on the both surfaces of which were formed resist patterns, as a result, a both surfaces printed wiring board without any defect could be produced from the material.

Example 5

A material to be developed having a through hole which is the same prepared in Example 1 or 2 was prepared. Then, a liquid developing treatment was applied to the electrostatic latent image-formed surface of the material to be developed by using a liquid developing device which was of the type of the above-mentioned liquid developing device shown in the FIG. 2, which was capable of subjecting to liquid developing of the material to be developed with a width of 510 mm, and as the constitution of a pair of liquid squeezing rolls 12, it comprises a roll made of an elastomeric material (nitrile butyl rubber is wound to an axis made of SUS 304 to have a surface hardness of the finished product of 45 degree or more) as an upper liquid squeezing roll 13, and a liquid-absorbing roll 14 (as a liquid-absorbing material having capillary action, specific polyurethane having a pore volume of 5 to 10 µm, water retention power of 300% is formed to a roll state) as a lower squeezing roll 14. Moreover, by using a liquid developing device to which two electrode portion conveying rolls 31 made of a nitrile butyl rubber, a shower-type developing solution-feeding means 33 at the bottom side, and a roll cleaning means 32 to which a liquid-absorption sheet having a pore size of 5 to 10 µm, a void ratio of about 80% and having a high liquid-maintaining property is applied, were provided, liquid developing treatment was carried out and the material to be developed immediately after the pair of the squeezing rolls 12 was observed, then, no liquid toner existed in the through hole. Thus, it was confirmed that by using the pair of the liquid squeezing rolls 12 according to the constitution of the present invention, excessive amount of the liquid toner could be surely removed from the material to be developed including the through hole.

Moreover, the material to be developed was so placed at an inlet portion of the device that an upper surface of which became the surface to be developed to which an electrostatic latent image had been formed, and conveying of the material was started with 1.0 m/min. Thereafter, by applying a corona statically charging treatment to the non-developing surface from the conveying direction, the surface thereof was statically charged to +85V substantially uniformly. Then, at the liquid toner developing portion 2, a liquid toner (positive charge toner, available from Mitsubishi Paper Mills, Ltd., "ODP-TW", trade name) was fed to an upper surface and simultaneously a bias voltage of +150V was applied to the same, electrodeposition of the liquid toner to the surface to be developed according to the electrophotographic reverse developing method was completed. At this time, an auxiliary conveying of the material to be developed in the electrodes was carried out by the electrodes portion conveying rolls 31, and the liquid toner developing solution was uniformly fed with a flow amount of 5 L/min to the non-developing surface according to the liquid feeding means 33 at the bottom side. Moreover, at a drying portion 3, the dispersing medium in the liquid toner remained at the surface of the material to be developed was evaporated and removed by a ventilation means 18 to effect drying of the liquid toner. Then, at a fixing portion 4, fusion and fixation of toner particles were completed by a heating means 19 to obtain a resist pattern corresponding to a wiring pattern. Moreover, to prepare a both-surfaces printed wiring board, the electrophotographic laminated board was reversed upside down, and the same treatments were carried out. According to these procedures, no image stain occurred on the surface of the product to be developed including the neighbor of the through hole and good resist pattern could be obtained.

Example 6

Moreover, 30 sheets of materials to be developed having through holes were prepared, and 15 sheets thereof were subjected to the procedure according to one surface stepwise developing method to obtain resist patterns on the both surfaces. Then, the liquid developing device was stopped for 24 hours and the remaining 15 sheets were again subjected to the same procedure as mentioned above to prepare a both surfaces resist pattern. As a result, good resist patterns could be formed on the both surfaces of the electrophotographic laminated board with regard to the latter 15 sheets without toner stain including the neighbor of the through hole.

As explained above, when a both-surfaces printed wiring board is to be prepared by the electrophotographic reverse developing method according to the liquid developing method of the present invention, occurrence of defects caused by liquid toner stain at a non-developed surface at the time of applying the one surface stepwise developing system can be prevented irrespective of the thickness of the material to be developed, and occurrence of the liquid toner stain at a non-developed surface including the neighbor of a through hole(s) can be prevented even when a both-surfaces printed wiring board having a through hole(s) is to be produced. Moreover, when a both-surfaces through hole printed wiring board is to be prepared, an excessive amount of liquid toner can be simply and easily, and effectively removed after a developing treatment in the through hole and on the surface of the electrophotographic laminated board, and a wiring pattern corresponding to a static latent image can be formed with good reproducibility for a long period of time.

What is claimed is:

1. A liquid developing method for preparing a printed wiring board comprising the steps of providing a material to be developed comprising an insulating substrate containing one or more conductive through holes, the substrate having two sides, which is copper-clad on both sides, and photoconductive layers coated on both copper-clad sides;

forming an electrostatic latent image on one side of the two sides;

statically charging the other side that does not have an electrostatic latent image to a surface potential of 80V or more before developing the electrostatic latent image side; and reversal developing the electrostatic latent image side with a liquid toner.

2. A liquid developing method for a printed wiring board which comprises the steps of providing a material to be developed comprising an insulating substrate having two sides, which are copper-clad on both sides, and photoconductive layers coated on both copper-clad sides;

forming a toner image on one side of the two sides;

overturning the material having a toner-imaged side and non-toner imaged side;

statically charging and exposing the non-toner imaged side to form an electrostatic latent image;

electrostatically charging the toner-imaged side before developing the electrostatic latent image side; and developing the latent image side to form a resist pattern.

3. The method of claim 2, wherein a surface potential of the substrate side having no electrostatic latent image is 80V or more.

4. The method of claim 3, wherein said material has one or more through holes.

5. The method of claim 2, wherein said material has one or more through holes.

6. A liquid developing method for preparing a printed wiring board comprising the steps of providing a material comprising an insulating substrate having two sides, which are copper-clad on both sides, and photoconductive layers coated on both copper-clad sides;

forming an electrostatic latent image on one side of the two sides;

statically charging the other side that does not have an electrostatic latent image before developing the electrostatic latent image side; and reversal developing the electrostatic latent image side with a liquid toner; and removing an excessive amount of the toner in the step of reversal developing the electrostatic latent image side with a liquid toner by combination of a liquid-absorption roll having a capillary function at the side that does not have an electrostatic latent image and a roll made of an elastic material having no liquid-absorbing property at the side having an electrostatic latent image.

* * * * *